United States Statutory Invention Registration [19]

[11] Reg. Number: H707

Hu et al. [43] Published: Nov. 7, 1989

[54] METHOD OF PREVENTING LATCH-UP FAILURES OF CMOS INTEGRATED CIRCUITS

[75] Inventors: Chemning Hu, Hercules; Kyle W. Terrill, Berkeley, both of Calif.

[73] Assignee: The United States of America as represented by the Secretary of the Navy, Washington, D.C.

[21] Appl. No.: 59,237

[22] Filed: Jun. 8, 1987

Related U.S. Application Data

[63] Continuation of Ser. No. 677,826, Dec. 4, 1984, abandoned.

[51] Int. Cl.[4] ..... H01L 21/265

[52] U.S. Cl. ..... 437/26; 437/20

[58] Field of Search ..... 437/26

[56] References Cited

U.S. PATENT DOCUMENTS

| | | | |
|---|---|---|---|
| 3,595,716 | 7/1971 | Kerr et al. | 29/571 |
| 3,895,965 | 7/1975 | MacRae et al. | 148/1.5 |
| 4,161,417 | 7/1979 | Yim et al. | 148/175 |
| 4,224,733 | 9/1980 | Spadea | 29/571 |
| 4,282,648 | 8/1981 | Yu et al. | 29/576 |
| 4,317,686 | 3/1982 | Anand et al. | 148/1.5 |
| 4,418,469 | 12/1983 | Fujita | 29/577 C |
| 4,454,524 | 12/1984 | Spence | 357/23 |
| 4,536,947 | 8/1985 | Bohr et al. | 29/576 C |

OTHER PUBLICATIONS

Hu and Bruce, IEEE Electron Device Letters, vol. EDL-5, No. 6, Jun. 1984, pp. 211-214 "CMOS Structure".

Takacs et al., IEDM 83, 1983 IEEE, pp. 156-163 "Comparison of Latch-up in P- and N well CMOS".

Jerdonek, et al., IEDM 82, 1982 IEEE, pp. 450-453 "Reduced Geometry CMOS Technology".

Huang et al., IEDM 82, 1982, IEEE, pp. 454-457 "Characterization of CMOS Latch up".

Byrne, P. F. "Megavolt Arsenic Implantation into Si", *Electronic Research Laboratory,* Aug. 12, 1982, pp. 1-13.

Byrne et al, "Megavolt Ion Implantation into Silicon".

Byrne et al, "Damage Induced Through Megavolt Arsenic Implantation" *Appl. Phys. Lett.,* 41(6) Sep. 15, 1982, pp. 537-539.

Sadana et al, "Recrystallization . . . ", *Appl. Phys. Lett.* 44 (3) Feb. 1, 1982, pp. 301-303.

Washburn et al, "Crystalline to Amorphous . . . ", Nuclear Instruments & Methods, pp. 345-350.

Byrne et al, "Megavolt Arsenic Implantation", *Thin Solid Films,* 95 (1982) pp. 363-367.

Byrne et al, "Megavolt Boron & Arsenic Implantation", Materials Research Society, Symposia Proceeding.

Byrne, P. F. "Megavolt Dopant Implantation" Presentation for Degree of Doctor of Philosophy.

Byrne, P. F. "High Energy Ion Implantation" *J. Appl. Physics* 54 (2), Feb. 1983, pp. 1146-1147.

*Primary Examiner*—Stephen C. Buczinski

*Assistant Examiner*—Linda J. Wallace

*Attorney, Agent, or Firm*—Edward J. Connors, Jr.; Melvin J. Sliwka; William C. Townsend

[57] ABSTRACT

A method for preventing latch-up in an integrated circuit structure, and in particular, in a CMOS structure, includes the use of a high-energy blanket or maskless ion implant that reduces the substrate resistance by creating a highly ion doped buried layer in the semiconductor device. The thickness and the positioning of the heavily doped layer can be accurately ascertained through the ion implantation process. The transition region between the highly doped buried layer and the lightly doped substrate is sharper, and thus the suppression of latch-up is more effective than in prior devices fabricated with prior techniques. An increase in the holding and critical currents is found, due to the reduced substrate resistance.

26 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

| TECHNOLOGY | HOLDING CURRENT | CRITICAL CURRENT |
|---|---|---|
| CONVENTIONAL COMS | 1x | 1x |
| RETROGRADE WELL | 3.3 x | N A |
| EPITAXIAL | 6.0x | 33x |
| HIGH ENERGY IMLANT<br>$2 \times 10^{13}$ cm$^{-2}$<br>$1 \times 10^{14}$ cm$^{-2}$ | <br>8 x<br>30x | <br>35 x<br>90x |

METHOD OF PREVENTING LATCH-UP FAILURES OF CMOS INTEGRATED CIRCUITS

This application is a continuation of application Ser. No. 677,826, now abandoned, filed on Dec. 4, 1984.

TECHNICAL FIELD

The present invention is related to integrated circuit structure technology, and in particular, to CMOS technology.

BACKGROUND ART

Integrated circuit chips and in particular CMOS (Complementary-Metal-Oxide-Semiconductor) integrated circuit chips fabricated with bulk silicon techniques can exhibit a phenomenon known as latch-up if triggered by a high enough voltage level. During latch-up the integrated circuit is short circuited, with the result that the integrated circuit draws excessive current and power from the power supply, usually resulting in thermal destruction of the integrated circuit chip.

Examination of the CMOS integrated circuit structure generally reveals that a vertical p-n-p bipolar transistor is formed by the $p^+$ (more heavily doped p region) drain/source regions of the p-channel MOSFET (metal-oxide-semiconductor field-effect-transistor), the n-tub and the p-substrate. Furthermore, there is a lateral n-p-n transistor consisting of the n-tub, p-substrate and $n^{30}$ (more heavily doped n region) drain/source regions of the n-channel MOSFET. The structure is often complicated further by the inclusion of input protection diodes ($n^+p$ to the substrate and $p^+n$ to the n-well), and $p^+$ contacts to the substrate and $n^{30}$ contacts to the tub. The presence of these bipolar transistors constitute a potential n-p-n-p device that can latch-up if the right conditions are met.

Basically a necessary condition for latch-up to exist is that the product of the n-p-n and p-n-p transistor gains exceed unity. In addition, the end junctions of the structure must somehow become forward biased. This condition is not satisfied in normal operation, but it could occur during a transient or in a high radiation environment. The final condition is that the VDD supply and the input circuit be capable of supplying the holding current of the p-n-p-n device. The p-n-p-n structure can then go into positive feedback and behave like a short circuit. The signal feeds upon itself and grows exponentially until it turns into an uncontrollably large current short-circuit path.

The more compact the CMOS structure becomes in order to pack more components economically on a chip, the smaller the components become and the closer the junctions are, resulting in increased latch-up problems.

Methods of reducing or eliminating the latch-up tendency include the use of lightly doped epitaxial layer over heavily doped substrate and guard rings around the devices. Of these methods, the heavily doped substrate method has proven to be at least partially successful in preventing latch-up in CMOS integrated circuitry.

This method includes the use of a thick heavily doped starting substrate, as for example a $p^+$ material, onto which is grown by an epitaxial method a thin layer of lightly doped material, as for example a $p^-$ material. The thick heavily doped starting substrate effectively shorts out the above described parasitic junction, preventing the development of a forward bias across a pair of junctions.

The epitaxial layer is created by a well-known technique. Basically the heavily doped starting substrate material is placed in a furnace. Through a gaseous chemical process, molecules are deposited on the starting material in order to form the epitaxial layer which is an extension of the crystal structure of the starting substrate material.

The disadvantages associated with this type of solution are as follows. First normally the growth of epitaxial layers is not accomplished in-house by a semiconductor manufacturer. This is considered a specialty operation which is one of the most difficult steps in the CMOS fabrication process. As such, this fabrication involves greater expense and extra logistical difficulties.

The second disadvantage is that it is relatively difficult to control the thickness of the deposited epitaxial layer. This is due to the fact that furnace temperature and time controls, as well as several other controls, are not precise enough. Thus as the trend toward making more compact CMOS structures with thinner and thinner layers continues, such techniques will not prove practicable.

The third disadvantage is that when the chip is subjected to subsequent fabrication steps, such as the driving in of p-wells or n-wells, the heavily doped substrate will diffuse toward the surface of the chip. In order to counteract this, the highly doped starting material is positioned further away from the surface, which is counterproductive to producing compact CMOS structures. However even so, the diffusion process evens out the previously sharp demarcation between the epitaxial layer and the highly doped area. It is to be understood that as the sharpness between the heavily doped starting material and the lightly doped epitaxial material is reduced, there is an accompanying degradation in anti-latch-up performance.

The present invention is directed to overcoming the above disadvantages.

SUMMARY OF THE INVENTION

The present invention is directed toward preventing latch-up in semiconductor structures with the introduction of a heavily doped buried layer. Thus in a p-type semiconductor, a heavily doped p material would be beneath a lightly doped p material, and the integrated circuit would be built upon this combination. In an n-type semiconductor, a heavily doped n layer would be configured below a lightly doped n layer, with the remainder of the integrated circuit provided on this combination. The heavily doped buried layer increases the holding current and voltage and the critical current to such a level that latch-up does not occur during operation of the semiconductor structure. The reason for this is that the heavily doped layer located close to the p-n junctions essentially shorts the junctions out so that the junctions cannot be forward biased. Accordingly, positive feedback does not occur with the resultant high current and power consumption and thermal destruction of the integrated circuit chip.

As an aspect of the invention, the buried layer is implanted with a high-energy beam of ions underneath the surface of the lightly doped substrate. The depth of penetration of the ions can be controlled by the energy of the ion beam. A higher energy beam will implant the ions deeper into the substrate. It is to be understood that the ion implant can be a blanket implant over the entire wafer and does not require an extra masking step. Further the high-energy implant can be easily incorporated into existing integrated circuit fabrication without any process changes.

In another aspect of the invention, the buried layer formed by the high energy implant is introduced into the fabrication process after a p- or n-well is driven into the substrate. Thus there is no redistribution of the ions in the buried layer upward toward the surface of the substrate during the well drive-in process, as occurs with the heavily doped layer when an epitaxial layer is created on the surface of the substrate. Accordingly, the doping concentration transition region is much smaller than obtained under the fabrication of an epitaxial layer on a substrate. Thus with a sharper transition, the heavily doped layer can be put closer to the rest of the integrated circuitry structure.

Following directly from this, the buried layer introduced through a high-energy ion beam can be of a better quality and more uniform in thickness than the layers provided by the prior art. Accordingly, the sizing and scaling of the buried highly doped layer can be more accurately controlled. This becomes of increasing importance as the size of the semiconductor circuitry continues to become more compact.

Yet another advantage and aspect of the invention is that the high-energy implant can occur in-house at the site of the semiconductor fabrication without the wafer having to be sent out to a special vendor which provides the epitaxial layer. Accordingly, the process is considerably less expensive and logistically simplified.

The implant of the high-energy ions leaves no damage in the original substrate. This can be demonstrated since the junction leakage current with and without high-energy implant is basically the same. Accordingly there is no additional need for an annealing step other than that which would be normally performed with semiconductor chip fabrication.

In another aspect of the invention, the implantation step can be performed before a well is driven into the substrate. Unlike the above-indicated invention process of driving in the well before the implantation step, this has the slight disadvantage that there is some diffusion of the buried layer as the well is being driven in. However, this has the great advantage that this step is performed before any masking steps are performed and thus eases the manufacturing process. Accordingly the stock material which is used for the chip fabrication can already have the high-energy buried layer implant, provided therein, prior to the fabrication of the rest of the chip. It is to be appreciated that such a process would reduce the cost of chip fabrication.

Accordingly a method of the invention for preventing latch-up in an integrated circuit structure comprises the steps of providing a lightly doped substrate and implanting a similar, more heavily doped layer beneath the surface of the lightly doped substrate. The remainder of the interrated circuit structure is then fabricated upon the lightly doped substrate.

The implantation step of the method includes the step of driving the ions into the lightly doped substrate with a high-energy beam of said ions.

The depth of the implantation is controlled by the energy level of the ion beam.

BRIEF DESCRIPTION OF THE FIGS.

DETAILED DESCRIPTION OF THE PREFERRED EMBODIMENT

Figure 1:
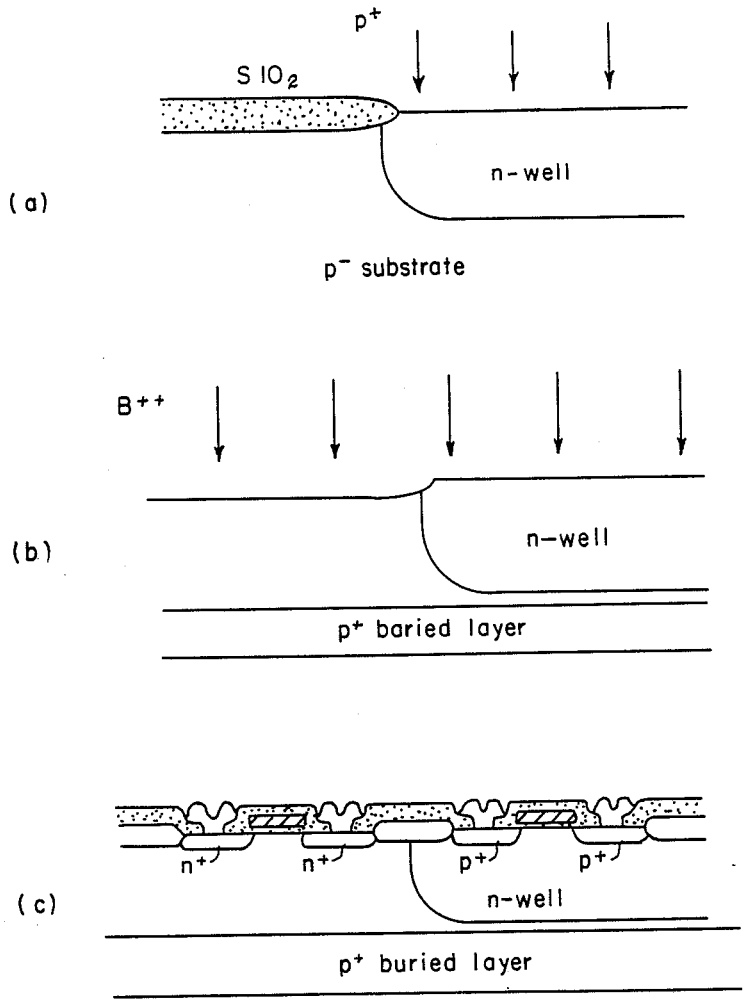
FIG. 1 shows three steps in the fabrication process of the invention.

FIG. 1 depicts a method of the invention. While this method deals with a p or $p^-$ substrate (lightly doped ion substrate) with a $p^+$ buried layer (more heavily doped layer), it is to be understood that the invention can also be practiced with an n type substrate and an $n^{30}$ type buried layer. In the invention, after the n-well is driven into the $p^-$ substrate material, the $p^+$ buried layer can be fabricated (FIG. 1(*b*)). This is fabricated by a high-energy boron ($B^{++}$) ion implant technique so that the buried layer is positioned immediately below the n-well. After this step is accomplished, the remainder of the integrated circuit can be fabricated on top of the substrate as shown in FIG. 1(*c*).

An example of this fabrication process is as follows. It is to be understood that the description of the fabrication process given herein is but one example of the method of the invention.

Fabrication Process

In an embodiment of the invention, a 3-micron n-well technology was used with a 4 MeV boron implant into a CMOS process (FIG. 1). This is a 3-micron $n^+$ polysilicon gate process with a gate oxide of 50 nm. The starting material was 20–30 ohm-cm p-type (100) oriented wafers. The n-well was defined by using LOCOS technology, and phosphorus ions were implanted (125 KeV) with doses in the range $1.0–4.0\times10^{12}cm^{-2}$ to form n-well regions. A drive-in of the implanted phosphorus is performed at 1150° C. for 16 hr. All oxide was then removed from the wafer surfaces and the wafers were implanted with boron at 4 MeV. FIG. 1(b) shows the addition of this high-energy implant to the process sequence. During the implant the substrate was water cooled to maintain its temperature at 300° K. No special annealing steps were added. Instead, the implantation was followed directly by a 50 nm 1000° C. dry oxidation. The remaining steps needed to fabricate the devices resulted in a heat cycle consisting mainly of 8 hours and 10 minutes at 1000° C.

Figures 2, 6:
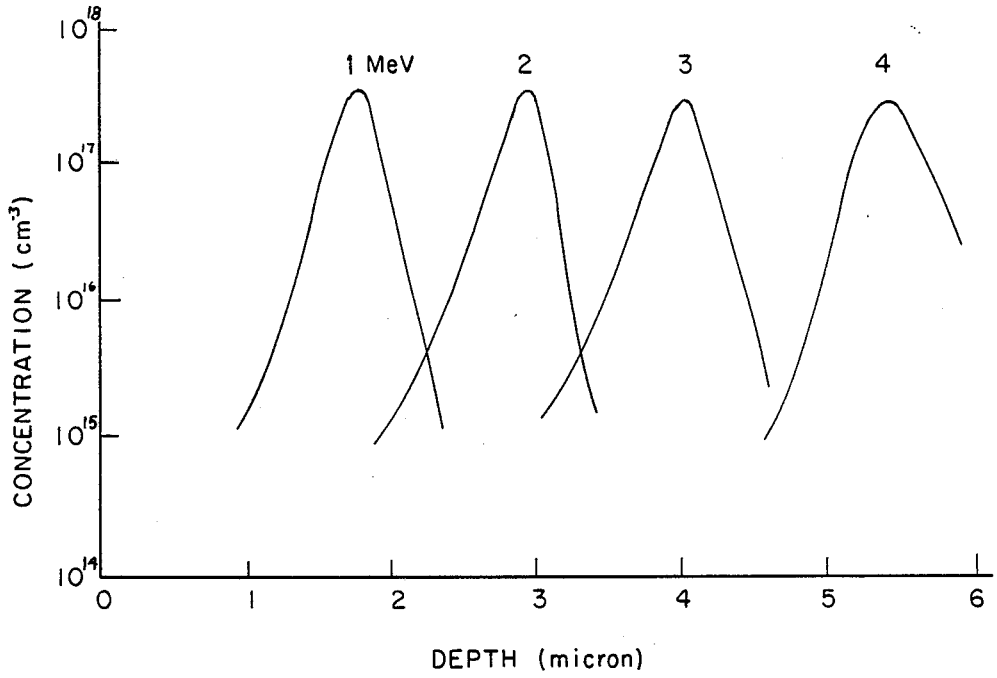
FIG. 2 shows an ion implantation profile according to the energy level of the high-energy beam.
FIG. 6 depicts a comparison table showing the increase in holding current and critical current with the teachings of the invention in comparison to the prior art.

While the above process requires a 4 MeV boron implant to place a $p^+$buried layer below a 4 micron deep n-well, processes with shallower wells require considerably less energy. FIG. 2 shows the dopant distribution of 1, 2 3 and 4 MeV boron implanted into silicon for a dose of $1\times10^{13}cm^{-2}$. This FIG. shows that a 2 micron n-well requires only a 2 MeV implant. A 2 MeV implant is relatively straightforward to accomplish, and it is to be understood that there are at least two equipment manufacturers marketing implanters capable of 3–4 MeV boron implants. These implanters have a wafer throughput of 60 wafers/hour for doses of $1\times10^{13}cm^{-2}$.

From the above it can be seen that the distance below the surface of the semiconductor material where the high-energy implant comes to rest is a function of the energy in the high-energy beam. The distance is basically the distance required of the ions to lose their energy. It is to be understood that any damage caused by this implantation step can be repaired by the subsequent annealing steps which are part of the normal chip fabrication process. No special annealing step is required.

Figure 3:
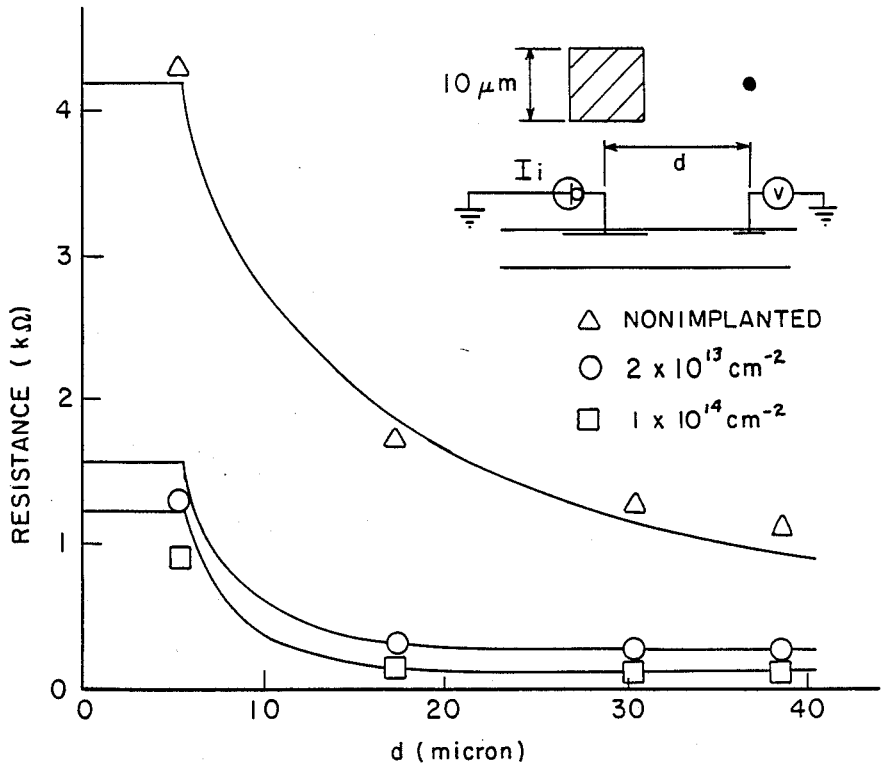
FIG. 3 depicts the resistance levels for a semiconductor structure fabricated according to the invention.

As the high-energy implant forms a highly conducting buried layer just beneath the device structures, this implant reduces the substrate spreading resistance. FIG. 3 shows the transverse resistance of a surface contact as a function of the distance "d" from the edge of the injector for nonimplanted and implanted regions. FIG. 3 shows this reduction of resistance for implanted substrates. FIG. 3 demonstrates how the present invention prevents latch-up in a semiconductor structure and in particular in CMOS. Qualitatively, the resistance axis of FIG. 3 represents the effectiveness of the heavily doped buried layer in shorting out the previously described p-n-p-n junctions. The heavily doped buried layer provides a shunting path to short out these junctions. The lower the resistance, the better the junctions are shorted out. Accordingly there is no forward biasing at operating current and voltage, and no likelihood of structure latch-up.

Figure 4:
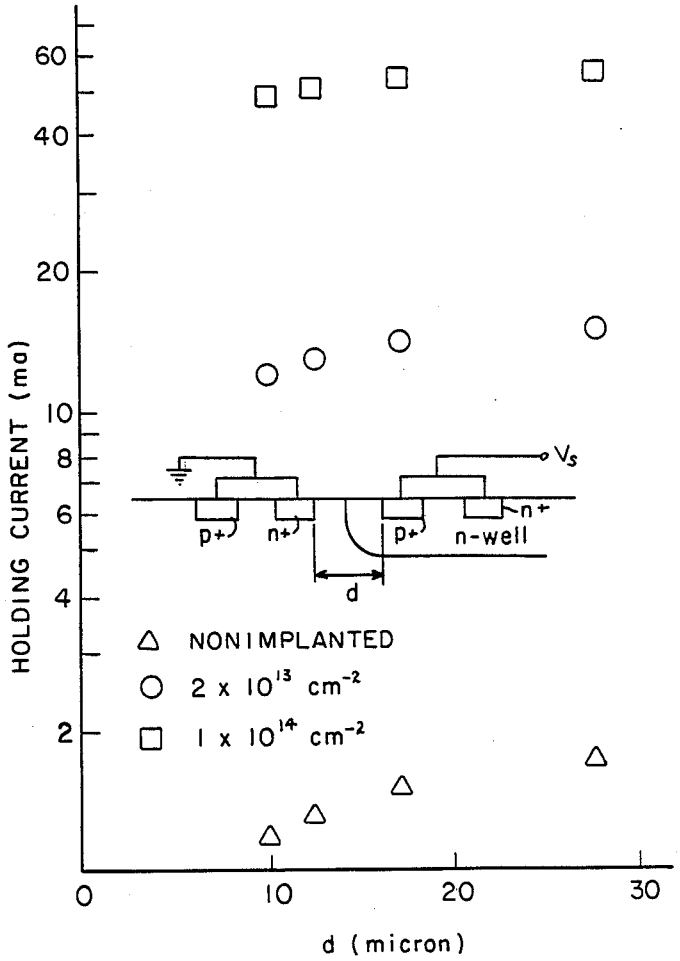
FIG. 4 depicts the holding current levels of a semiconductor chip fabricated according to the invention.
Figure 5:
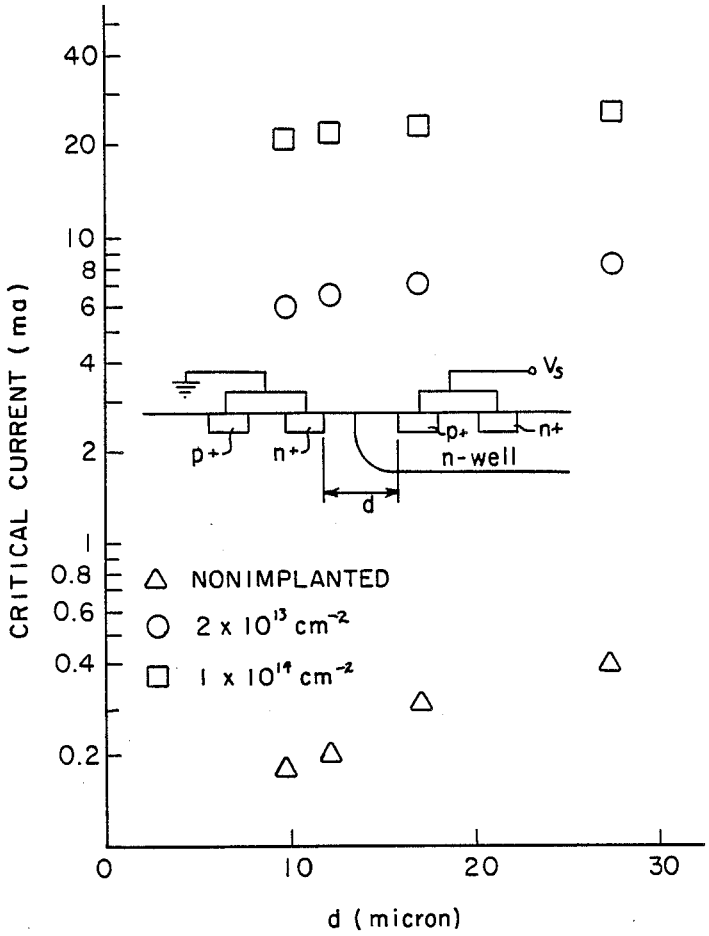
FIG. 5 depicts the critical current levels for a semiconductor structure fabricated according to the invention.

To test the effectiveness of the 4 MeV boron implant in reducing latch-up susceptibility, both the holding current and the critical current for the latch-up test structure are measured (FIGS. 4, 5). In FIGS. 4, 5 the holding current and critical current as a function of the distance "d" between the $n^{30}$ and $p^+$emitters for both nonimplanted and implanted regions are shown. The holding current needed to sustain latch-up has been increased by a factor of 8 for an implant does of $2\times10^{13}cm^{-2}$ and a factor of 30 for an implant dose of $1\times10^{14}cm^{-2}$, while the critical current has been increased by factors of 35 and 90 respectively. Comparing the increase in holding current, at 10 microns for example, it can be seen that it is roughly equal to the decrease in the substrate resistance shown in FIG. 3. These results are summarized in FIG. 6 and compared to the results obtained from other technologies. The superiority of these results over the results obtained using a p type epitaxial layer on a $p^+$ substrate is attributed to the reduced boron transition region obtained with this technology.

It is to be understood that the high-energy ion implant beam can be composed, in the preferred embodiment, of either boron or gallium ions for p type implantation or phosphorus or arsenic ions for n type implantation.

In an alternate embodiment of the method of the invention, the highly doped buried layer can be driven into the lightly doped substrate with a high-energy beam of ions prior to the driving in of the well. The advantage of such a process is that stock material upon which the remainder of the integrated circuit is fabricated already has the buried highly doped layer, and thus economies of scale attributable to mass production prior to the fabrication of the rest of the chip are realized. The disadvantage of this method over the prior method of the invention is that the sharpness between the lightly doped and the highly doped layers will be somewhat diffused during the process of implanting the well.

From the above it can be seen that with the method of the invention latch-up in integrated circuit devices can be eliminated, along with the reduction of fabrication costs. The method can be practiced in-house without interrupting the rest of the fabrication process itself. The method is of increased advantage as the scaling down of components, particularly for CMOS applications, increases due to the demand for more components to be fabricated on any given size of silicon.

Other advantages and objects of the invention can be obtained from a review of the claims and the appended FIGS.

We claim:

1. A method of preventing latch-up in an integrated circuit structure comprising the steps of:

providing a lightly ion doped substrate;

implanting a more highly ion doped buried layer of the same conductivity type beneath the surface of the lightly doped substrate;

fabricating the remainder of the integrated circuit structure on the lightly ion doped substrate.

2. The method of claim 1 wherein the implanting step includes the step of driving the ions into the lightly ion doped substrate with a high energy beam of said ions.

3. The method of claim 1 wherein the implanting step includes the step of controlling the depth of implantation of the ions in order to control the depth of the highly ion doped buried layer.

4. The method of claim 2 wherein the implanting step includes the step of driving the ions into the lightly ion doped substrate with a high energy beam of said ions to a predetermined depth by controlling the level of energy of the high energy beam.

5. The method of claim 1 including the step of implanting an ion well in the lightly ion doped substrate prior to implanting the highly ion doped buried layer.

6. The method of claim 5 including the step of implanting the highly ion doped buried layer beneath the ion well.

7. The method of claim 1 including the step of implanting an ion well, in the lightly ion doped substrate after the implanting of the highly ion doped buried layer.

8. The method of claim 7 including the step of implanting the highly ion doped buried layer beneath the ion well.

9. The method of claim 1 including the step of using boron to dope the highly ion doped layer.

10. The method of claim 1 including the step of using gallium to dope the highly ion doped layer.

11. The method of claim 1 including the step of using phosphorus to dope the highly ion doped layer.

12. The method of claim 1 including the step of using arsenic to dope the highly ion doped layer.

13. A method of preventing latch-up in a CMOS integrated circuit structure by increasing the holding voltage comprising the steps of:

providing a lightly ion doped substrate;

implanting a similar, more highly ion doped layer beneath the surface of the lightly ion doped substrate with a high energy beam of said ions.

14. The method of claim 13 including the step of fabricating the remainder of the integrated circuit structure on the lightly ion doped substrate.

15. The method of claim 13 wherein the implanting step includes the step of driving the ions into the lightly ion doped substrate using a high energy beam of said ions.

16. The method of claim 15 wherein the implanting step includes the step of driving the ions into the lightly ion doped substrate with a high energy beam of said ions to a predetermined depth by controlling the level cf energy of the high energy beam.

17. The method of claim 13 including the step of implanting an ion well in the lightly ion doped substrate prior to implanting the highly ion doped buried layer.

18. The method of claim 17 including the step of implanting the highly ion doped buried layer beneath the ion well.

19. The method of claim 13 including the step of implanting an ion well in the lightly ion doped substrate after the implanting of the highly ion doped buried layer.

20. The method of claim 19 including the step of implanting the highly ion doped buried layer beneath the ion well.

21. A method of preventing latch-up in an integrated circuit structure comprising the steps of:

providing a lightly doped p-type substrate;

implanting a more highly doped p-type layer buried beneath the surface of the lightly doped p-type substrate;

fabricating the remainder of the integrated circuit structure on the lightly doped p-type substrate.

22. The method of claim 21 including the step of using boron to dope the highly doped layer.

23. The method of claim 21 including the step of using boron to dope the highly doped layer.

24. A method of preventing latch-up in an integrated circuit structure comprising the steps of:

providing a lightly doped n-type substrate;

implanting a more highly doped n-type layer buried beneath the surface of the lightly doped n-type substrate;

fabricating the remainder of the integrated circuit structure on the lightly doped n-type substrate.

25. The method of claim 24 including the step of using phosphorus ions in the implanting step.

26. The method of claim 24 including the step of using arsenic ions in the implanting step.

* * * * *